(12) United States Patent
Song et al.

(10) Patent No.: US 10,895,596 B2
(45) Date of Patent: **\*Jan. 19, 2021**

(54) METHOD AND SYSTEM FOR QUICKLY IDENTIFYING CIRCUIT COMPONENTS IN AN EMISSION IMAGE

(71) Applicant: INTERNATIONAL BUSINESS MACHINES CORPORATION, Armonk, NY (US)

(72) Inventors: Peilin Song, Lagrangeville, NY (US); Franco Stellari, Waldwick, NJ (US)

(73) Assignee: International Business Machines Corporation, Armonk, NY (US)

(\*) Notice: Subject to any disclaimer, the term of this patent is extended or adjusted under 35 U.S.C. 154(b) by 647 days.

This patent is subject to a terminal disclaimer.

(21) Appl. No.: 15/412,517

(22) Filed: Jan. 23, 2017

(65) Prior Publication Data
US 2017/0131350 A1 May 11, 2017

Related U.S. Application Data

(63) Continuation of application No. 12/778,544, filed on May 12, 2010, now Pat. No. 9,581,642.

(51) Int. Cl.
*G01R 31/311* (2006.01)
*G06T 7/00* (2017.01)
(Continued)

(52) U.S. Cl.
CPC ........ *G01R 31/311* (2013.01); *G01R 31/2853* (2013.01); *G06T 7/001* (2013.01);
(Continued)

(58) Field of Classification Search
CPC ........................ G01R 31/311; G01R 31/2621; G01R 31/025; G01R 31/30; G01R 31/2831;
(Continued)

(56) References Cited

U.S. PATENT DOCUMENTS 5,940,545 A 8/1999 Kash et al.
6,172,512 B1\* 1/2001 Evans .................. G01R 31/311
324/762.02
(Continued)

OTHER PUBLICATIONS

Pan, Y., et al. "Firefly: Illuminating Future Network-On-Chip With Nanophotonics" 36th International Symposium on Computer Architecture (ISCA '09). Jun. 2009. pp. 429-440.
(Continued)

*Primary Examiner* — Florian M Zeender
*Assistant Examiner* — Milena Racic
(74) *Attorney, Agent, or Firm* — Tutunjian & Bitetto, P.C.; Daniel Morris

(57) ABSTRACT

Methods and systems for localizing and resolving an integrated circuit include selecting one or more electrical stimuli to be applied to a device under test such that the electrical stimuli provide a baseline image and a distinguishing image effect when applied to the device under test. The one or more electrical stimuli are applied to the device under test. Emissions from the device under test are measured to provide a measurement data set and to collect the baseline image and the distinguishing image effect. The measurement includes dividing a field of view in a photon emission image into regions of interest. The measurement data set is analyzed to localize and evaluate circuit structures by comparing the baseline image and the distinguishing image effect. The analysis includes calculating a figure of merit for each region of interest that represents a degree of switching activity in the respective region of interest.

22 Claims, 10 Drawing Sheets

(51) Int. Cl.
*G06T 7/11* (2017.01)
*G01R 31/28* (2006.01)

(52) U.S. Cl.
CPC ...... *G06T 7/11* (2017.01); *G06T 2207/10056* (2013.01); *G06T 2207/30148* (2013.01)

(58) Field of Classification Search
CPC .......... G01R 31/2851; Y10T 29/49004; H03K 19/094; G01N 21/8806; G01N 23/04
See application file for complete search history.

(56) References Cited

U.S. PATENT DOCUMENTS

| | | | |
|---|---|---|---|
| 6,327,394 B1 * | 12/2001 | Kash | G01R 31/311 324/617 |
| 6,342,701 B1 * | 1/2002 | Kash | G01J 3/2889 250/458.1 |
| 6,496,022 B1 * | 12/2002 | Kash | G01R 31/311 324/754.23 |
| 6,625,769 B1 * | 9/2003 | Huott | G01R 31/308 714/725 |
| 6,774,647 B2 | 8/2004 | Kash et al. | |
| 6,909,295 B2 | 6/2005 | Polonsky et al. | |
| 6,943,578 B1 * | 9/2005 | Sanda | G01R 31/308 324/762.02 |
| 7,039,884 B2 * | 5/2006 | Kitchin | G01R 31/311 716/136 |
| 7,378,859 B2 * | 5/2008 | Stellari | G01R 31/311 324/754.23 |
| 7,612,571 B2 | 11/2009 | Stellari et al. | |
| 7,774,662 B2 * | 8/2010 | Motika | G01R 31/318547 714/726 |
| 7,852,102 B2 * | 12/2010 | Kitagawa | H01L 22/12 324/762.01 |
| 7,872,485 B2 * | 1/2011 | Colvin | G01R 31/311 324/754.23 |
| 8,107,718 B2 * | 1/2012 | Breton | G01R 31/31835 382/145 |
| 8,754,633 B2 * | 6/2014 | Ng | G01R 31/311 324/97 |
| 2004/0041575 A1 * | 3/2004 | Desplats | G01R 31/2656 324/762.09 |
| 2005/0002028 A1 | 1/2005 | Kasapi et al. | |
| 2008/0054931 A1 * | 3/2008 | Zhao | G01R 31/307 324/754.22 |
| 2008/0164414 A1 | 7/2008 | Stellari et al. | |
| 2011/0025831 A1 * | 2/2011 | Bewersdorf | G02B 21/16 348/50 |
| 2014/0103935 A1 * | 4/2014 | Pfaff | G01R 31/2656 324/501 |

OTHER PUBLICATIONS

Polonsky, S., et al. "Off-State Luminescence in Metal-Oxide-Semiconductor Field-Effect Transistors and Its Use As On-Chip Voltage Probe" Applied Physics Letters. vol. 85, No. 12. Sep. 2004. pp. 2390-2392.

Polonsky, S., et al. "Picosecond Imaging Circuit Analysis of Leakage Currents in Cmos Circuits" Proceedings from the 28th Symposium for Testing and Failure Analysis. Nov. 2002. pp. 387-389.

Prejean, S., et al. "Backside Deprocessing of CMOS SOI Devices for Physical Defect Failure Analysis" Proceedings from the 29th Symposium for Testing and Failure Analysis. Nov. 2003. pp. 99-104.

Song, P., et al. "Timing Analysis of a Mircoprocessor PLL Using High Quantum Efficiency Superconducting Single Photon Detector (SSPD)" Proceedings from the 30th Symposium for Testing and Failure Analysis. Nov. 2004. pp. 197-202.

Stellari, F., et al. "Circuit Voltage Probe Based on Time-Integrated Measurements of Optical Emission From Leakage Current" Proceedings from the 28th Symposium for Testing and Failure Analysis. Nov. 2002. pp. 667-672.

Stellari, F., et al. "Evaluating PICA Capability for Future Low Voltage SOI Chips" Proceedings from the 34th Symposium for Testing and Failure Analysis. Nov. 2008. pp. 407-416.

Stellari, F., et al. "High-Speed CMOS Circuit Testing by 50 PS Time-Resolved Luminescence Measurements" IEEE Transactions on Electron Devices. vol. 48, No. 12, Dec. 2001. pp. 2830-2835.

Stellari, F., et al. "Local Probing of Switching Noise in VLSI Chips Using Time Resolved Emission (TRE)" Proceedings of North Atlantic Test Workshop (NATW). May 2005. (8 pages).

Stellari, F., et al. "Testing of Ultra Low Voltage VLSI Chips Using the Superconducting Single-Photon Detector (SSPD)" Proceedings of European Symposium on Reliability of Electron Devices, Failure Physics and Analysis (ESREF). Sep. 2004. pp. 1663-1668.

Tosi, A., et al. "Hot-Carrier Luminescence: Comparison of Different CMOS Technologies" 2003 IEEE. Proceedings of European Solid-State Device Research Conference (ESSDERC). Sep. 2003. pp. 351-354.

Tosi, A., et al. "Hot-Carrier Photoemission in Scaled CMOS Technologies: A Challenge for Emission Based Testing and Diagnostic" Proceedings of 44th Annual International Reliability Physics Symposium. Mar. 2006. (7 pages).

Tsang, J., et al. "Picosecond Hot Electron Light Emission From Submicron Complementary Metal-Oxide-Semiconductor Circuits" Applied Physics Letters, vol. 70, No. 7. Feb. 1997. pp. 889-891.

* cited by examiner

METHOD AND SYSTEM FOR QUICKLY IDENTIFYING CIRCUIT COMPONENTS IN AN EMISSION IMAGE

BACKGROUND

Technical Field

The present invention relates to integrated circuit analysis and more particularly to a system and method for localization and resolvability of an integrated circuit using a set of stimuli to provide varying images for analyzing of the circuit.

Description of the Related Art

Analytical tools are commonly used for characterizing, testing, and debugging VLSI circuits. Some tools and techniques, such as emission tools based on off-state leakage currents and laser based stimulation tools, focus mostly on improving manufacturing process steps such as reducing leakage and variability, or improving performance and yield. Other tools and techniques, such as Time-Resolved Emission (TRE), focus mostly on probing time dependent signals from specific nodes and transistors of very large scale integration (VLSI) circuits to understand behavior and performance. In another type of application, some faulty behavior of the chip may be investigated to understand the cause and possibly guide process engineers or circuit designers to fix a problem in new releases of hardware.

The continuous trend of modern complementary metal oxide semiconductor (CMOS) VLSI circuits towards miniaturization makes the precise localization and interpretation of the measured results more and more challenging. In particular, some features of interest have become smaller than the theoretical diffraction limit of the optics available to the modern microscope and analytical tools. These needs have sparked many developments in many areas such as optics, image processing, detector technology, etc. In particular, Solid Immersion Lens (SIL) has replaced the conventional air gap microscopy lens permitting a significant increase in the numerical aperture of collection optics, thus increasing both the lateral spatial resolution and the collection efficiency. Developments continue since such techniques are commonly used by most analytical methods in this area.

Additionally, image post-processing techniques have been proposed and are under evaluation to improve signal separation for tools that provide 2D images of samples such as static emission tools, laser stimulation tools, and 2D TRE tools. Detector improvements are also under way to increase the sensitivity to small signals as well as increase the number of pixels and reduce their size. For certain techniques, such as 2D TRE, the availability of three dimensions (x,y,t) permits additional room for separating signals since events taking place in close spatial position but at different instants in time may still be separated.

Many types of methodology improvements are also being proposed, mostly specific to particular analytical techniques. For example, two photon absorption may improve lateral spatial resolution of laser stimulation techniques. Additionally, near field microscopy, with all the complications and limitations associated to it, may lead to increased spatial resolution in static emission measurements for certain localized areas of interest.

SUMMARY

A method for localization and resolvability of an integrated circuit includes selecting one or more electrical stimuli to be applied to a device under test such that the electrical stimuli provide a baseline image and a distinguishing image effect when applied to the device under test. The one or more electrical stimuli are applied to the device under test. Emissions from the device under test are measured to provide a measurement data set and to collect the baseline image and the distinguishing image effect. The measurement includes dividing a field of view in a photon emission image into regions of interest. The measurement data set is analyzed to localize and evaluate circuit structures by comparing the baseline image and the distinguishing image effect. The analysis includes calculating a figure of merit for each region of interest that represents a degree of switching activity in the respective region of interest.

A system for localization and resolvability of an integrated circuit includes an electrical stimuli component configured to apply a set of stimuli to a device under test such that the electrical stimuli are selected to provide a baseline image and a distinguishing image effect when applied to the device under test. An emission measurement system is configured to collect emissions from the device under test to provide a measurement data set and to collect the baseline image and the distinguishing image effect. The emission measurement system is further configured to divide a field of view in a photon emission image into regions of interest. A data comparison module is configured to analyze the measurement data set by performing a comparison between the baseline image and the distinguishing image effect to localize and evaluate circuit structures of the device under test. The analysis includes a calculation of a figure of merit for each region of interest that represents a degree of switching activity in the respective region of interest.

A system for localization and resolvability of an integrated circuit includes an electrical stimuli component configured to apply a set of stimuli to a device under test such that the electrical stimuli are selected to provide a baseline image and a distinguishing image effect when applied to the device under test. A Picosecond Imaging for Circuit Analysis (PICA) system is configured to collect photon emissions from the device under test for each electrical stimuli in the set of stimuli to provide a measurement data set and to collect the baseline image and the distinguishing image effect. The PICA system is further configured to divide a field of view in a photon emission image into regions of interest. A photon database is configured to collect information for emitted photons to generate at least one of a static image and a time-resolved image corresponding to at least two states associated with stimuli in the set of stimuli. A data comparison module is configured to analyze the measurement data set to localize and evaluate circuit structures of the device under test by performing image processing between images of the two states. The analysis includes a calculation of a figure of merit for each region of interest that represents a degree of switching activity in the respective region of interest.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
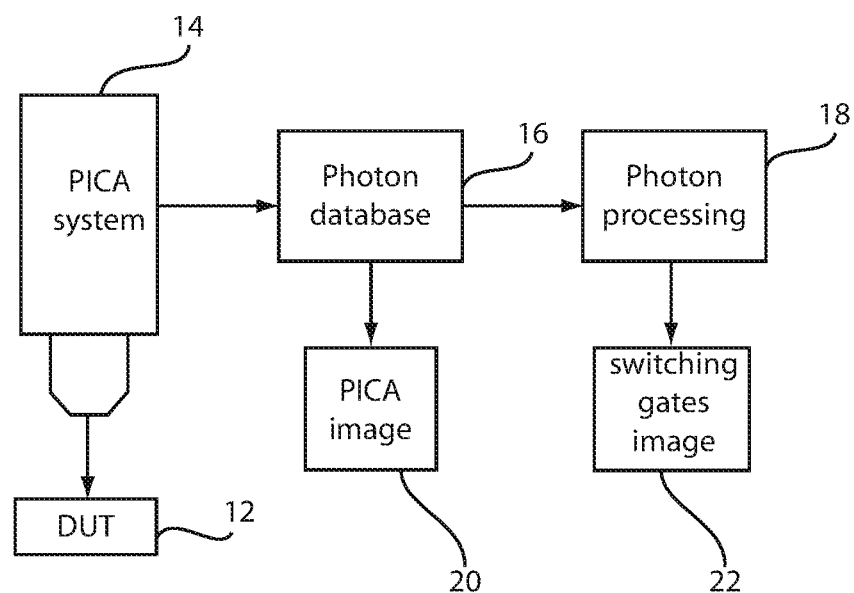
FIG. 1 is a block/flow diagram showing a photon emission collection system in accordance with one illustrative embodiment.

Picosecond Imaging for Circuit Analysis (PICA) is a very powerful optical methodology that permits probing time resolved emission signals collected from transistors inside a circuit. By neglecting the arrival time of the photons and constructing a spatial histogram of the measured photons one can create a "PICA image" of the emission intensity. Bright spots indicate individual transistors or sub-circuit unit composed by several transistors. By selecting a portion of the image (for example drawing a box around a region of interest) one can then create a histogram of the photon arrival time and therefore a waveform in time of the emission activity from that location.

Alternatively, 2D images of the photons at specific times can be created and then a video can be constructed by combining frames together. It should be noted that more than one bright spot is usually present in such a type of PICA image and the emission may correspond either to gates that are not switching (Light Emission from Off-State Leakage Current, LEOSLC) or are switching with a certain frequency (luminescence emission).

There are several applications which would gain from quickly distinguishing which bright spot or spots correspond to a switching gate, and which do not. One example relates to debugging electrical exercisers (patterns) of a circuit to quickly identify which gate is exercised by the specific pattern, pattern tuning and pattern debugging. This also helps in applications such as logic state mapping. Another type of application relates to security and detecting undesired chip alterations: in this case, by identifying the set of switching gates and their position in the layout and comparing it to a golden set would easily permit detection of undesired alterations to the circuit.

In another application, being able to detect which gate is switching among many non-switching identical gates helps in circuit probing and diagnostics when limited information about schematic, layout and circuit behavior is available to a tool operator. Another application includes assisting the tool operator in better defining and optimizing the region of interest for extracting time resolved waveforms or for further probing with single point detectors. By easily identifying the regions that correspond to switching gates, one could more easily define the border of the region of interest for creating the timing waveform thus gathering the maximum useful signal and at the same time cut out non-useful DC background that would reduce the signal to noise ratio of the waveform.

In accordance with the present principles, systems and methods are provided which quickly identify switching gates and other components using emission images. In one example, a Picosecond Imaging for Circuit Analysis (PICA) system and a software method to analyze the corresponding data are employed. Emission images may be obtained through other systems as well, such as systems that measure electronic activity or other emissions. In a particularly useful embodiment, switching gates are quickly identified in a PICA emission image. Emission from switching gates is modulated in time, while non-switching gates either do not have an emission associated to them, or the emission is not modulated in time. PICA systems have the capability of acquiring time resolved emission simultaneously from different positions of a chip, thus creating a PICA image, resolved in time.

Since both switching and non-switching gates may be present in a field of view of a single PICA image, it is not trivial to identify quickly which gate is switching and which is not. A method for processing the PICA image data (either during the acquisition or after the acquisition has ended) is provided to identify the switching gates. The methods applied rely on the fact that only the emission from the switching gate is modulated, usually at the frequency of the chip clock or some other characteristics frequency of the device under test.

In addition, a tester-based approach is provided for identifying emission sites that will drastically enhance the device localization resolution. A methodology for high-end microprocessor diagnostics is provided which is based on combining electrical stimuli tuning provided by ATE (automatic test equipment) with optical characterization performed by emission tools. With image post-processing techniques, localization and identification can be simplified for devices that can be affected by electrical stimuli, such as clock frequency changes; logic state changes; switching activity (using time resolved emission measurements), etc. This whole process can be made in an interactive fashion. For a device of interest, we can generate or optimize the test pattern to separate it from its neighbor devices using light emission.

The present principles provide a system and method that provides a set of test stimuli designed to achieve an optical effect or optical difference in images to be able to distinguish one device or component from other in the images produced. The test pattern, program and/or sequence may be different depending on the devices that are to be visualized or mapped.

It should be understood that the present embodiment will describe an image, a baseline image and a distinguishing image effect. These images and effects include emission maps, both static and dynamic (e.g., time-resolved), waveforms (which include plots, but also include underlying data), or any other visual information to provide a comparison between two states of a device under test.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or mathematical analysis software such as Matlab™ (from Mathworks®) or the like and conventional procedural programming languages, such as the "C" programming language, automation and scripting languages such as AutoIt™ or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the FIGs. illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a schematic diagram for a system 10 for determining switching gates in accordance with one illustrative embodiment is shown. Emission (photons) from a Device Under Test (DUT) 12, such as complementary metal oxide semiconductor (CMOS) circuit, are measured by a PICA system 14 or equivalent. A spatial position (e.g., a single dimension, or two dimensions (x,y)) and an arrival time of each detected photon is stored in a database 16, such as a file on a computer. At the end of the measurement, the database 16 is processed by a photon processing device or module 18, for example, a computer program, to identify switching gates on the DUT 12. Information is then reported to a tool operator by some display graphics 22. The displayed image 22 may be an indication of switching/non-switching gates per each (x,y) location. In another embodiment only the photons corresponding to switching locations are retained and a PICA image 20 is constructed with such photons.

Figure 2:
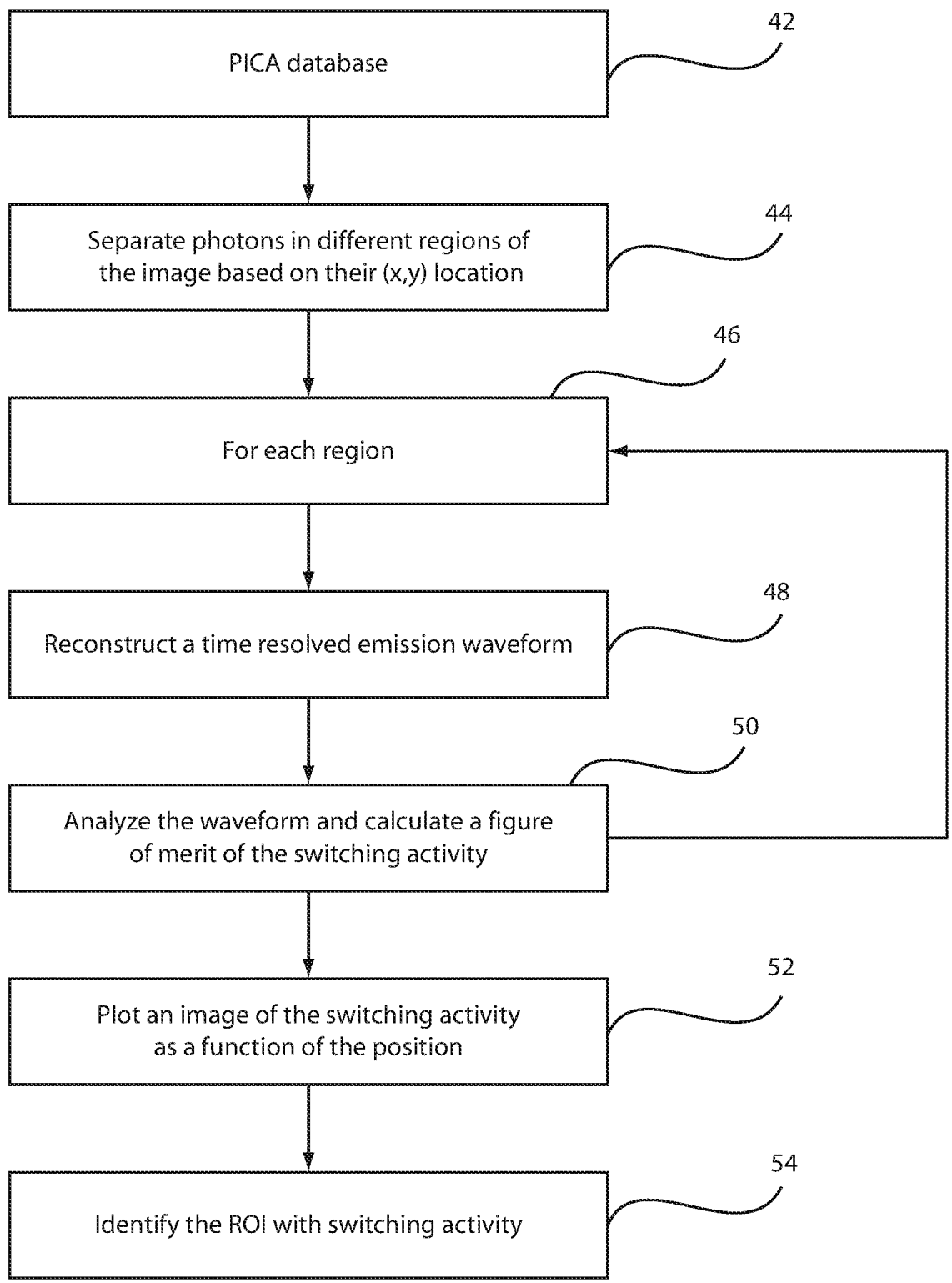
FIG. 2 is a block/flow diagram showing an illustrative method for generating a figure of merit and a region of interest image in accordance with one embodiment.

Referring to FIG. 2, a method for post processing data after PICA acquisition has ended is illustratively depicted. In block 42, the photon database 16, which includes the measured photons information (x, y spatial location and arrival time t) is processed by dividing an entire field of view in several regions of interest (ROI) in block 44. If we call W the width in pixels of the PICA image 20 and H the height in pixels of the PICA image 20, in one preferred embodiment, the PICA image 20 may be divided into N×M ROIs where the (i,j) ROI includes the pixels with coordinates $W/N*i<x<W/N*(i+1)$ and $H/M*j<y<H/M*(j+1)$, where $0<=i<=N-1$ and $0<=j<=M-1$.

In this way, the initial PICA image 20 is divided into ROI having identical areas. N may or may not equal M. N and M may also be chosen so that W/N=H/M. In block 44, alternate methods for dividing the initial image 20 may be employed, for example, non-uniform divisions where regions with a higher number of photon counts are divided into smaller regions while regions where there are less counts are divided into larger regions. The area of the region may be chosen so that the number of photons in each region is similar.

Block 46 provides a loop so that each region is visited. For each region, a single time resolved histogram/waveform of the photon arrival time is reconstructed in block 48. A Time Correlated Single Photon Counting (TCSPC) technique may be employed, which may neglect the position (x,y) of the photons inside the selected ROI. In block 50, the constructed PICA waveform (see FIG. 3) is then analyzed, possibly digital filters are applied, and a Figure of Merit (FOM) is computed. This FOM is a measure of the switching activity of the DUT in the selected ROI. In fact if the ROI includes a region without gates or a region where the gates are not switching, the emission is expected not to change in time. While if the there is one or more gates switching, the emission is expected to be modulated in time with the gate activity. Therefore, the FOM will be larger in the region with switching gates than in the region with non-switching gates.

Different methods may be used to compute the FOM. In one embodiment, a Fast Fourier Transformation (FFT) is applied to the PICA waveform in the ROI. A module (or absolute value) of the FFT of the waveform of the FOM may be provided for a selected ROI. Due to the switching activity of the gates in the ROI, several peaks would be visible at the main and harmonic frequencies of the gate switching frequency. These peaks can be detected using different methods, such as peak detection methods, and the peak amplitude could be used as a FOM. In the ROIs where there is more switching activity, the FFT peaks are expected to be larger than in the ROI where there is no or little switching activity.

Figure 3:
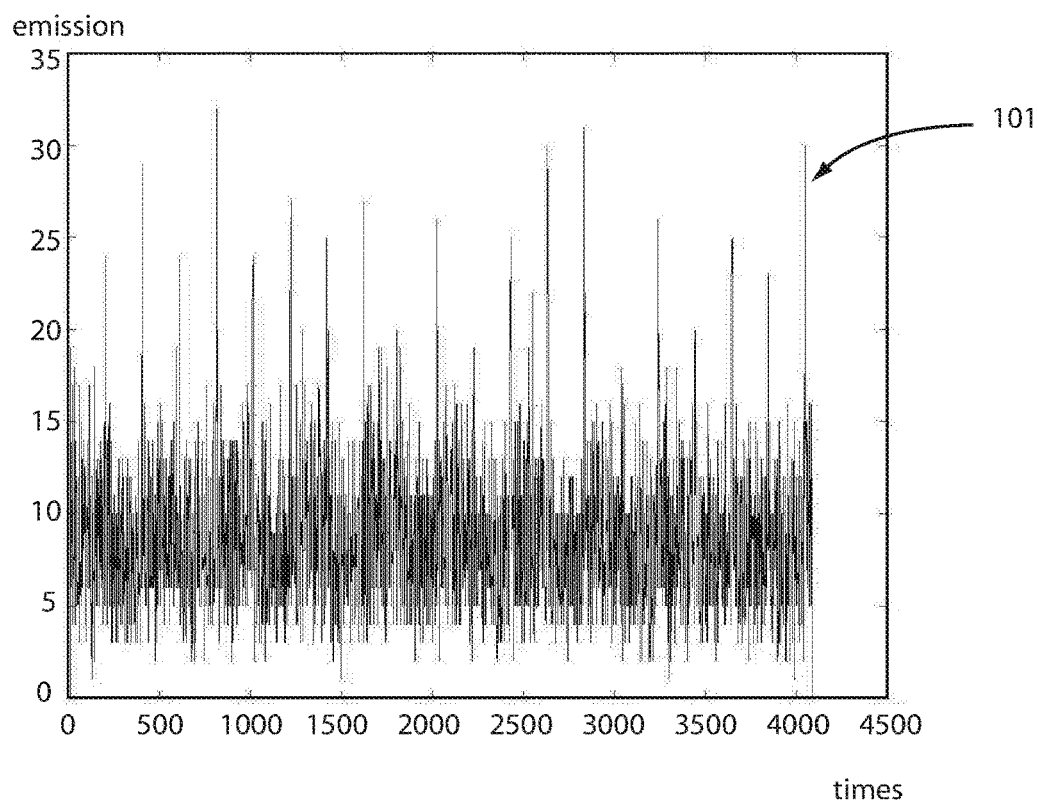
FIG. 3 is an illustrative time-resolved emission waveform for a region in an image.
Figure 4:
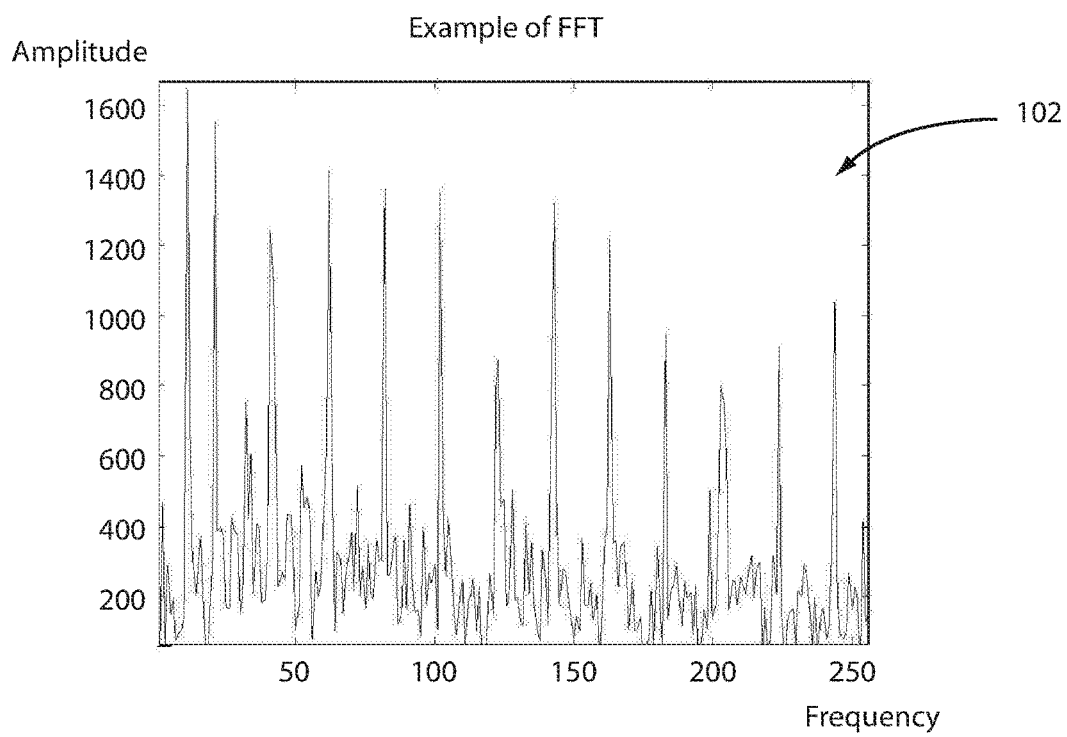
FIG. 4 is an illustrative Fast Fourier Transform applied to the data of FIG. 3.

FIG. 3 shows an illustrative histogram 101 of the arrival time of the photons from database 16 for a certain ROI of the image 20 (e.g., 1 pixel, several adjacent pixels, the entire area). FIG. 4 shows an FFT waveform 102 which results from FFT being applied to the histogram of FIG. 3. In a particular embodiment, the FOM could be calculated for example as the amplitude of one specific peak at a specific frequency (for example, the clock frequency of the DUT). Alternatively, the FOM could be an area of a selected peak. More than one peak may be used, for example, at harmonic frequency. A ratio of the variations inside the FFT waveform 102 compared to a mean value could also be used. In other embodiments for calculating the FOM, the FFT may not be used and other algorithms or methods may be applied directly to the waveform in FIG. 3. For example, differentiation of the waveform and subsequent measurement of the peaks in the differentiated waveform may be used. In a different embodiment, a (max-min)/mean method may be used. Other methods that permit the measure of switching activity versus non-switching waveforms may be employed as well.

Figure 5:
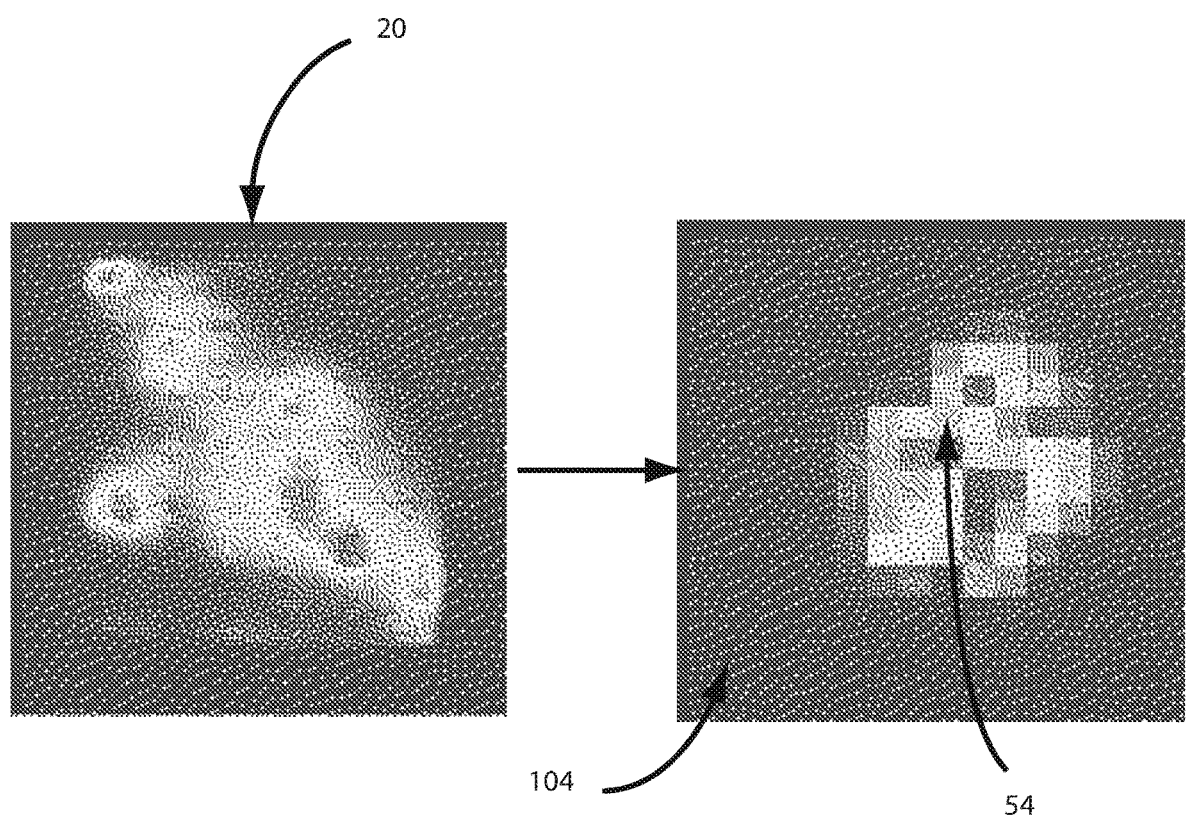
FIG. 5 is an illustrative PICA image processed to provide a figure of merit where regions have colors or textures indicating activity in the region (e.g., regions of interest)

Once the FOM is calculated in block 50, for each ROI, a map or plot of such FOMs is created in block 52. FIG. 5 shows an example of an original PICA image 20, and an image 104 of the FOM, a set of colors (not shown) represent a higher value of the FOM in that ROI while another set of colors (not shown) represent lower values of FOM. By this method, it is possible to simply locate the region with switching activity as indicated by a colored box (e.g., red) in block 54. Other types of image displays may be available, such as 3D plotting, contour plots, etc.

To speed up the identification process, N and M may be chosen to be small compared to W and H. In the case of FIG. 5, N=M=16. Therefore, an insufficient spatial resolution may be obtained as a first pass. Choosing N and M to be small has another advantage, besides speeding up the method, by concentrating more neighboring switching gates in a single ROI, a better signal to noise ratio may be achieved, thus simplifying the identification of the ROI with switching gates. Moreover, one may just want to verify if there are switching gates at all in the entire field of view (FOV), so a small N,M may be useful. This is of interest in particular for security applications and pattern debugging.

If the spatial resolution achieved with the first choice of N and M is not sufficient, the process may be repeated with a larger N and M iteratively until sufficient resolution is achieved. Examples may include M=N=32 or M=N=64 which lead to progressively finer spatial resolution but also longer analysis time. The increased spatial resolution permits better identification of the shape of the emitting gates as well as separate contributions from neighboring gates or transistors. In one case, three different emission sources were detected that were not easy to identify in either the original PICA image or the low resolution FOM image with M=N=16 as shown in FIG. 5. This may be particularly important for applications where neighboring gates are to be separated for tuning the waveform reconstruction process. For these applications, it may also be convenient to use a refinement process where only the ROIs with the higher FOM are further processed by dividing their area in smaller ROI. The procedure is then repeated for the same smaller ROIs and the FOM are re-plotted normalized for the differences in areas.

By refining the analysis in the ROI with higher FOM, a plot can be obtained with higher resolution showing that, e.g., actually two gates are switching instead of just one. By focusing only in these smaller areas, one can avoid wasting time in calculating FOM in a region with no switching activity to start with. This method is illustratively described in FIG. 6.

Figure 6:
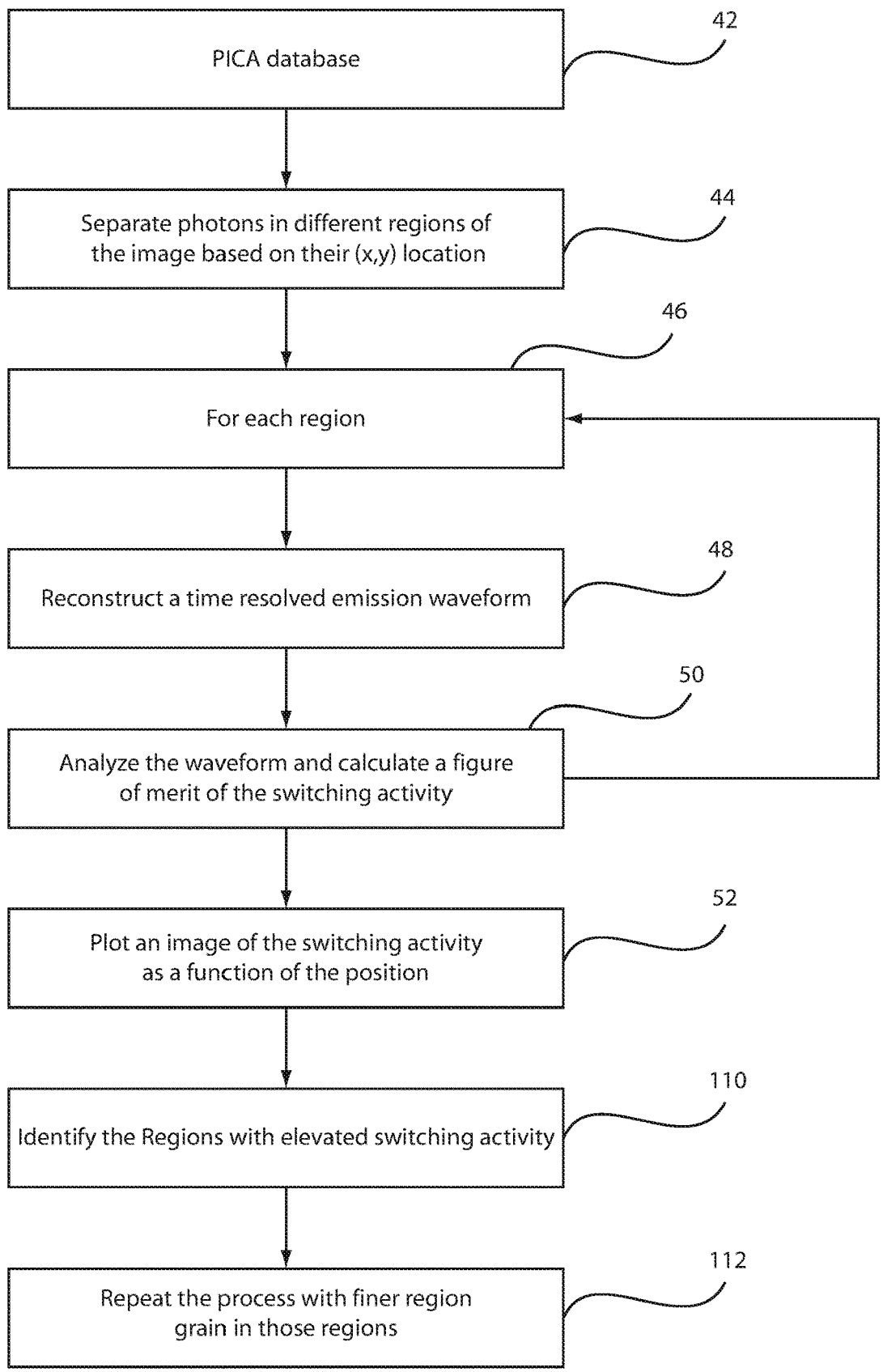
FIG. 6 is a block/flow diagram showing an illustrative method for generating a figure of merit and employing finer grained regions of interest based upon switching activity in accordance with another embodiment.

Referring to FIG. 6, blocks 42, 44, 46, 48, 50 and 52 are the same as in FIG. 2. In addition, this method includes blocks 110 and 112. In block 110, regions are identified with elevated switching activity. Once these regions are found, these regions are rendered with a finer resolution and the entire process is repeated to discover activity within the finer grained regions in block 112.

It should be understood that, although embodiments described herein compute the FFT of the waveforms in the region of interest, other techniques for creating a FOM of each ROI may also be employed. For example, photons can be subdivided based on their arrival time to create 2D images covering short periods of time (frames), the frame can be analyzed to identify regions that change in time with technology similar to that used for compressing video. In addition, the time resolved emission waveform for each ROI could be processed directly to identify if there are variations and how large such variations are without using an FFT. For example, statistical functions could be used such as FOM= (max-min)/mean or FOM=std.dev./mean. Low pass filters could be used to reduce noise fluctuations, while differentiation methods could be used to highlight the presence of transitions.

Another method permits an in-line analysis of the PICA image (20) while it is acquired, to gain useful information about switching gates. This method is particularly useful for quick debugging of patterns and localization of switching gates. This method includes that the method used for calculating the FOM is preferably a linear method (for example, the use of FFT is a linear type of transformation that can be used for this purpose). In this case, after PICA acquisition is started, a certain amount of time is passed or a certain number of photons have been detected, or upon user request, one of the previous methods is applied to such partial set of data while the acquisition continues. An image of the switching activity is therefore created based on the partial PICA data available at the moment. After another period of time (possibly a different period than before), or after a certain number of new photons have been detected, etc., another switching activity image is created by using just the new photon sets collected since the last switching image was created. This second switching image is then summed to the previous switching image by taking advantage of the FOM algorithm linearity. As a consequence the new image represents the switching activity of all the photons measured so far. This process can then continue until the end of the acquisition or the user decides to terminate it.

Figure 7:
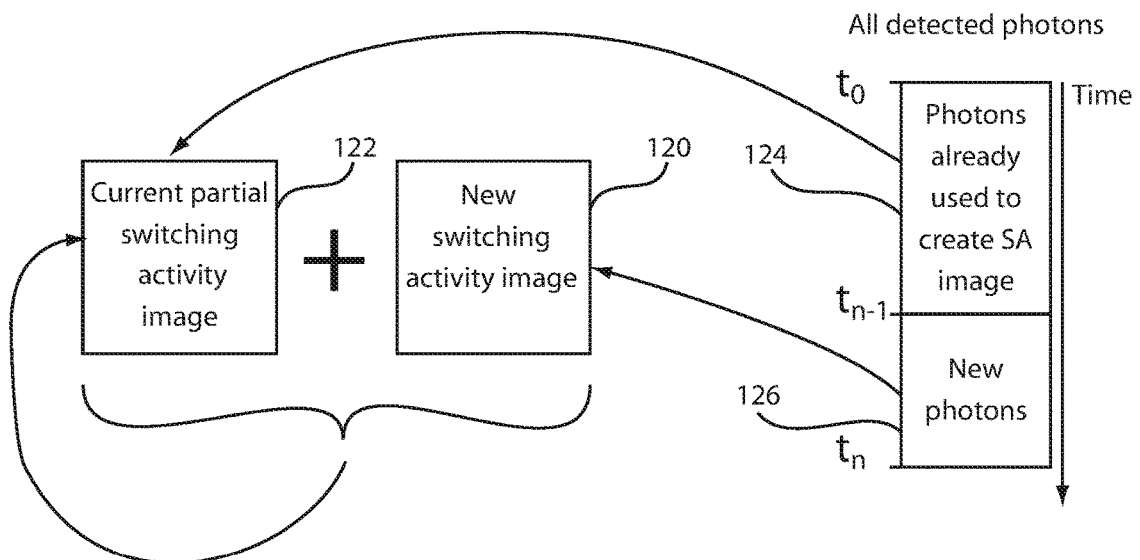
FIG. 7 is a block diagram showing a method for updating images in accordance with one embodiment.

Referring to FIG. 7, for a given time $t_n$ during an acquisition, a partial switching activity image 122 is available for all the photons acquired from $t_0$ (time the acquisition is started) to $t_{n-1}$ from an acquisition log 124 (e.g., database 16). The photons detected from $t_{n-1}$ to $t_n$ from an acquisition log 126 (e.g., database 16) are used to create a new switching activity image 120, such image 120 is then summed to the previous partial switching activity image 122 to create a new partial switching activity image (updated image 122) that incorporates all the photons from to $t_0$ $t_n$.

In another embodiment, the partial switching activity images are not overwritten but stored separately to study the evolution in time of the position or pattern of switching gates. For example, for mechanical drift correction, z focus correction, or monitor changes in the circuit due to fails (diagnostics/failure analysis application), intermittent behavior changes (security applications) and pattern alterations (pattern debugging).

In accordance with the present principles, a DUT may be subject to one or more different stimuli in different ways to achieve measurement results that can indicate a characteristic of the DUT. To this point we have described an illustrative embodiment where a switching gate was detected as a result of normal operation of a transistor or other device. These concepts may be generalized and employed in a number of useful embodiments. A tester-based approach for identifying emission sites that drastically enhances device localization resolution is illustratively depicted in FIG. 8. Such a methodology may be employed for high-end microprocessor diagnostics or the like. The method is based on combining electrical stimuli tuning provided by automatic test equipment (ATE) with optical characterization performed by emission tools. With image post-processing techniques, one can simplify localization and identification of devices that can be affected by electrical stimuli, such as clock frequency changes; logic state changes; switching activity (using time resolved emission measurements), etc. This whole process can be made in an interactive fashion. For the device that is of interest, we can generate or optimize the test pattern to separate it from its neighbor devices using light emission. Through experience, testing or other techniques, test sequences may be developed suitable for imaging identifying characteristics of different device components. A test matrix or test information may be made available to test personnel so that, e.g., switching gates are distinguishable from non-switching gates, determinations can be made regarding circuits that are expected to be working but are not and any other characteristics of an integrated circuit in operation. The test matrix may provide guidance as to what tests to perform, for how long, in what sequence, etc. to uncover the information desired for a given test or tests.

Figure 8:
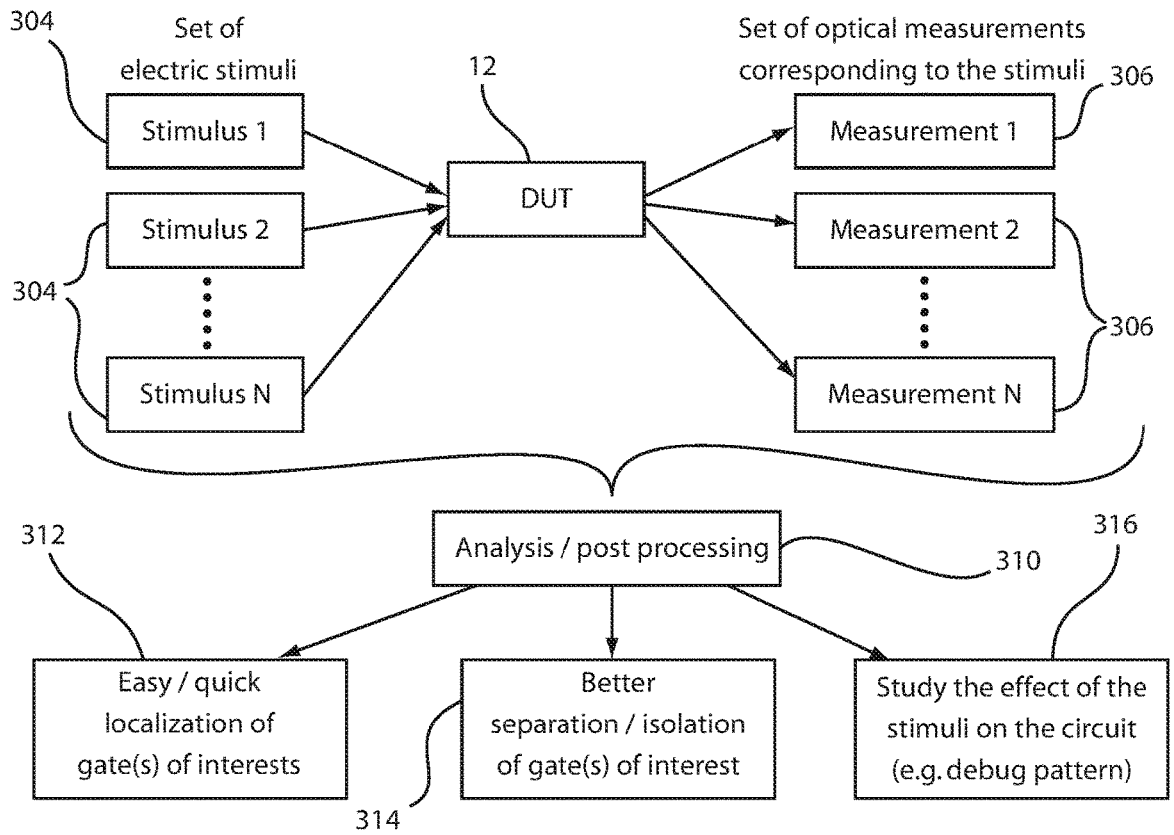
FIG. 8 is a block/flow diagram showing an illustrative system/method for analyzing a device using a stimuli set in accordance with one embodiment.

Referring to FIG. 8, a schematic diagram shows a system/ method for a tester-based approach in accordance with one illustrative embodiment. A certain stimulus 304 is applied to a device under test (DUT) 12 and a measurement 306 of the chip response to such a stimulus 304 is performed and analyzed to understand the chip behavior. The stimulus 304 may incorporate, for example, a voltage bias condition, a clock frequency, initialization pattern, functional pattern, temperature and cooling condition, a change of a signal frequency, a change of signal phase/delay, a change of the state of a gate, turning on/off (enabling/disabling) certain gates of sub-circuits, a change of a test pattern, a change of a functional exerciser, a change of one or more supply voltage, enabling/disabling a source of electrical noise, a change of the operating temperature, a change of a duty cycle, etc.

These stimuli 304 are selected to exercise the chip in a desirable and known condition to make it express a certain behavior that is to be investigated. The type of stimuli 304 may be determined for a particular application to decipher a particular components or response. For example, if a switching gate is to be determined/imaged, a baseline optical image is collected followed by a predetermined stimulus sequence designed to make the switching gate apparent in a second image. The DUT 12 is provided with a set of different stimuli, one at a time or are sequenced in a particular order. For each one of the stimuli 304, one or more measurements 306 of the chip (DUT 12) are collected. The set of measurements 306 is subsequently analyzed together based on the specific knowledge of the set of stimuli used.

The measurements 306 may include, e.g., time resolved emission waveforms from a single point, 2D time resolved PICA emission images, 2D time integrated (static) emission images, Scanning Time Resolved Emission (S-TRE) images, Laser Voltage Probing (LVP) waveforms from a single point, 2D Laser Voltage Probing (LVP) data obtained by raster scanning the laser, etc.

By combining the knowledge of the characteristics of the different stimuli 304 with the effect of each stimulus in the set of measurements 306, more information is achieved for analysis (block 310) than by using a single stimulus and measurement. In particular, three illustrative focuses of interest include: ease and increased pace for the localization process of certain gates/transistors/structures/macros of interest in block 312; increased resolvability (spatial lateral resolution) of gates, etc. of interest in block 314; and studying the effect of stimuli on circuit behavior such as for debugging a test pattern. It should be understood that a single stimulus and single or multiple measurement(s) is/are included. In addition, sequencing of a same stimulus and a same measurement may be performed as well as any combination of stimuli and measurements in block 316.

Figure 9:
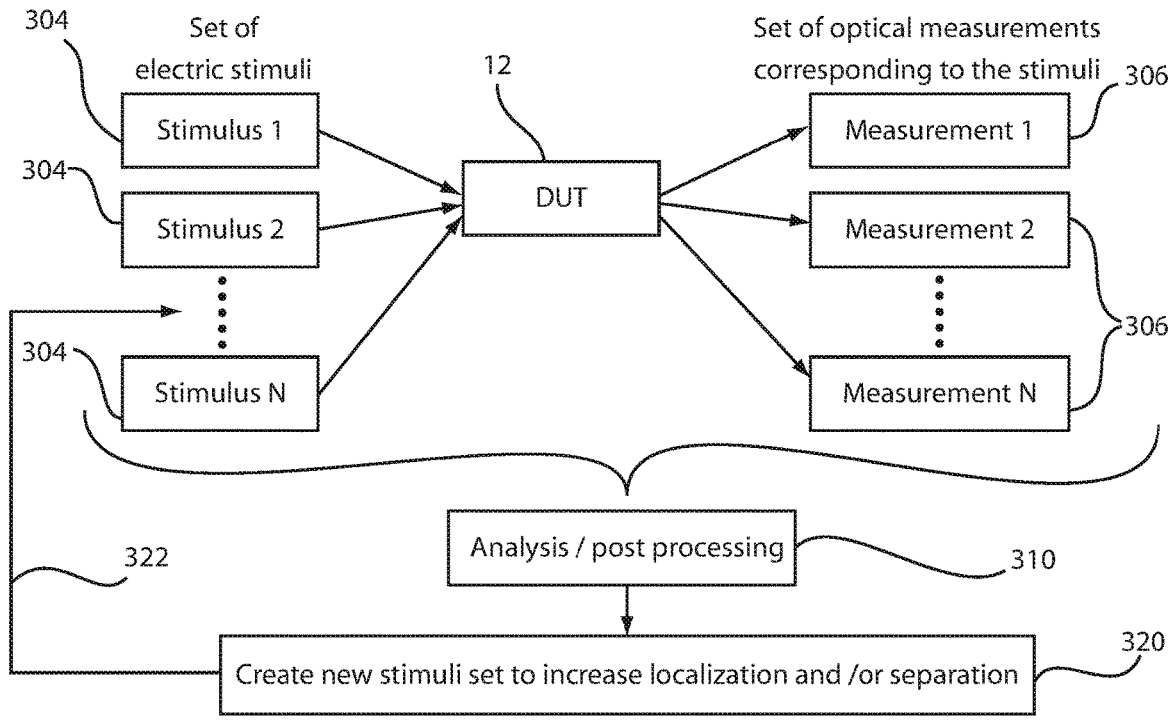
FIG. 9 is a block/flow diagram showing an illustrative system/method for analyzing a device using a stimuli set and changing at least the stimuli set using a feedback loop in accordance with another embodiment.

Referring to FIG. 9, a block/flow diagram shows the system/method of FIG. 8 extended to the case where a certain set of stimuli 304 and measurements 306 is first analyzed in the way previously described and acquired knowledge is subsequently used to create one or more new stimuli in block 320 to further investigate certain properties observed in the previous experiment. This feedback loop 322 may employ operator intervention or be automated based on specified criteria. In this case, it may be useful to use adaptive algorithms, neural networks, and other types of control and optimization methodologies.

The feedback loop 322 may be interrupted when the goal is reached for localization and/or isolation of a region or device is achieved or if further improvement has not been achieved. In the latter case, a different set of initial (seed) stimuli may be used to start the process again.

Figure 10:
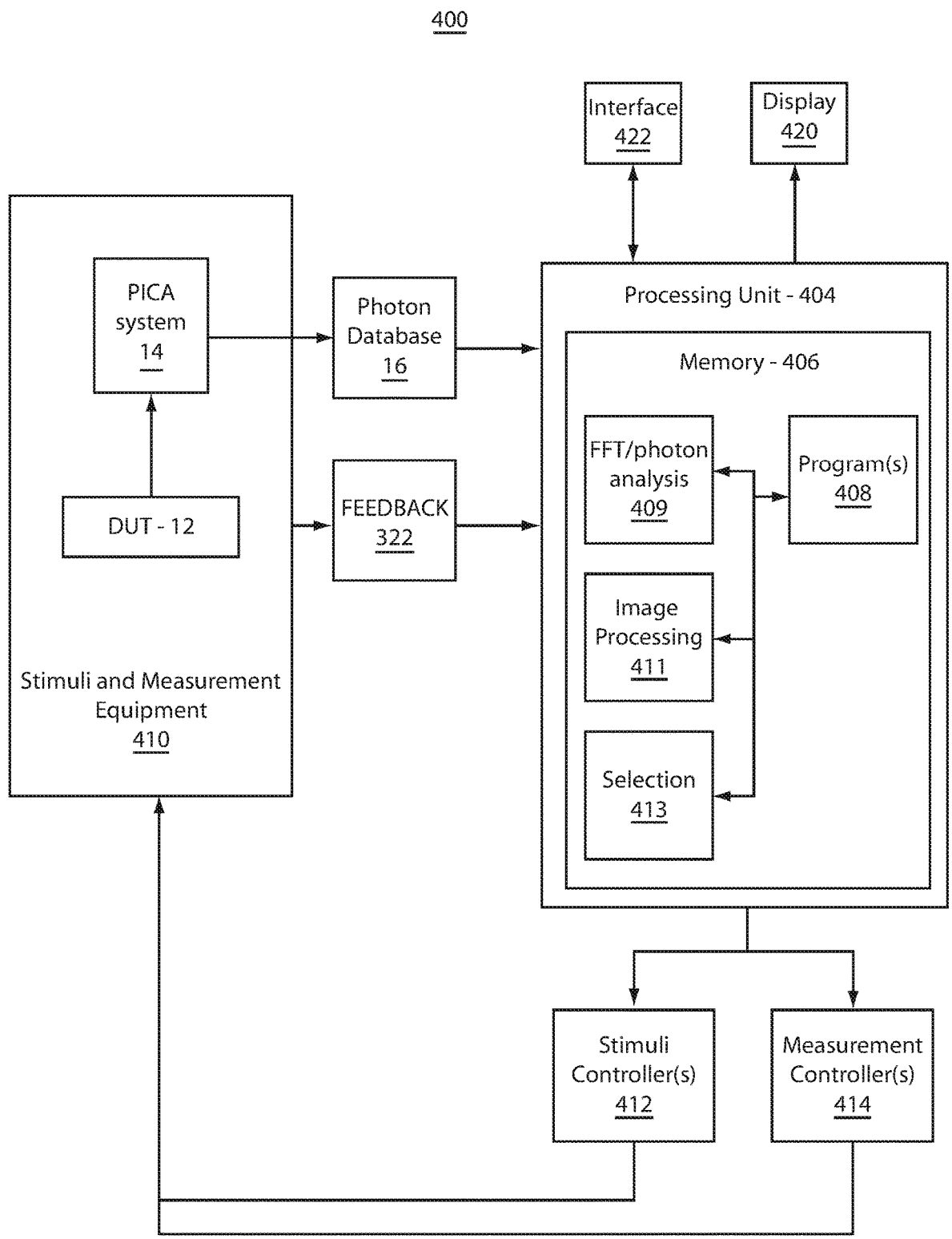
FIG. 10 is a block/flow diagram showing an illustrative system/method for emission collection and image comparison in accordance with another illustrative embodiment.

Referring to FIG. 10, a block diagram of a system 400 for quickly identifying circuit components in a time resolved emission image in accordance with one embodiment. The system 400 includes PICA system 14 or equivalent for monitoring photonic activity on the DUT 12. Collected photons are logged and stored in the database 16. Photon processing is performed using a processing unit 404, which is expanded in function over processor 18, as described with respect to FIG. 1. Processing unit 404 includes memory 406 which stores software modules for carrying out system functions. A program or programs 408 stored in memory 404 provide optimization and of images, selection of stimuli and measurement combinations, orchestration of system functions, etc. Separate modules may be includes to perform functions such as FFT/photon analysis in block 409, image processing in block 411, selection of stimuli and measurement sets in block 413, etc.

In one embodiment, system 400, generates an initial test program selection (selection block 413) of one or more stimuli for the DUT 12. The stimuli may include, e.g., for example, a voltage bias condition, a clock frequency, initialization pattern, functional pattern, temperature and cooling condition, a change of a signal frequency, a change of signal phase/delay, a change of the state of a gate, turning on/off (enabling/disabling) certain gates of sub-circuits, a change of a test pattern, a change of a functional exerciser, a change of one or more supply voltage, enabling/disabling a source of electrical noise, a change of the operating temperature, a change of a duty cycle, etc. This is a non-exhaustive list of possible stimuli of interest.

System 400 selects (selection block 413) measurements to be made based on the stimuli and the desired output data. The measurement may include, e.g., time resolved emission waveforms from a single point, 2D time resolved PICA emission images, 2D time integrated (static) emission images, S-TRE images, Laser Voltage Probing (LVP) waveforms from a single point, 2D Laser Voltage Probing (LVP) data obtained by raster scanning the laser, time Resolved (Dynamic) Emission (TRE)/Picosecond Imaging Circuit Analysis (PICA), both single pixel such as Emiscope III with InGaAs APD or SSPD, 2D imaging tools such as the Hamamatsu TriPhemos™, Scanning Time Resolved Emission (STRE), Time Integrated (Static) Emission, camera, such as CCDs, InGaAs cameras, MCT, etc., Laser Voltage Probing (LVP)/Ruby, etc.

These stimuli and measurement types may be varied one at a time, with all the other conditions remaining unchanged or multiple changes may be adopted at the same time. Once the test plan is determined, the processing unit 404 activates and adjusts stimuli controllers 412 and measurement controllers 414. These controllers 412 and 414 provide the proper settings and adjustments to the stimuli and measurement equipment 410 used for testing, probing, scanning etc. the DUT 12.

For example, the frequency/phase/delay/duty cycle of a certain input signal to the chip (DUT) may be changed. Alternatively, the test or functional pattern that is used to initialize the chip and to define how it should operate during the experiment could be modified to change the frequency/phase/delay/duty cycle of an internal signal compared to a certain reference signal. In another example, the on-chip clock frequency may be changed with respect to the reference clock provided to the chip. The change in clock frequency may alter the behavior of the chip in a way that can be detected during the measurements, thus helping in localization or isolation of certain regions of interest.

In yet another example, a first static measurement of the spontaneous emission from the chip may be acquired at frequency f1, subsequently the stimulus may be changed to that parts of the chip now run at a different frequency f2. Based on the knowledge that the emission intensity from a certain gate is a function of its switching frequency, by comparing the emission measurements at the two stimuli frequency f1 and f2, one could identify the gates affected by the clock signal.

In still another example, the state of a gate or macro may be changed to modify its response to laser stimulation or create a different emission pattern during static emission measurements. Alternatively, gates or macro may be activated or deactivated, for example, to reduce their background emission that would cause noise in measurements and mask areas of interest in close proximity. Changing the test pattern or functional exerciser is a very powerful and general way of affecting the circuit and may be used to cause most of the other changes through modifications of controllable parts of the circuit. For example, the operation of an on board Phase-Locked Loop (PLL) may be altered to change the clock properties. Measurements corresponding to different test patterns may also be used to verify and debug the correctness of the test/function program and its effect on the chip. Changing the supply voltage and operating temperature has many effects on both the chip behavior and the measurements. Certain parts of the circuit may be operated differently to remove a source of noise or create sources of noises to study their effect on other parts of the circuit behavior.

Stimuli and measurement equipment 410 may include one or more of the following non-exhaustively listed equipment. A tester or Automated Test Equipment (ATE) may be used to generate and transmit a different test program or functional exerciser to the DUT 12. This is one way to provide different types of stimuli especially for advanced circuit designs, such as microprocessors, where many on-chip test appliances and capabilities are available and can be easily controlled by a test program. Power supplies, possibly controlled by the tester/ATE, are used to define and change the supply voltage for the DUT or sub-sections of the DUT. External pulse/pattern generators may be used to control the properties of switching signals such as external clocks in ways similar as described.

Other stimuli/measurement equipment (410) may include a Time Resolved Emission (TRE) measurement device, such as a DCG Systems Emiscope III™, using a single point detector. In this case, signal switching properties may be used, for example, to increase the time separation of switching events occurring from neighboring regions of the chip that cannot be resolved spatially by brute force optical improvements. In another example, certain neighboring gates may be turned off or their state changed to provide less background emission during the measurements. 2D TRE PICA measurements, such as the Hamamatsu TriPhemos™, may be employed. A Scanning TRE system may be employed since the measurement results are similar to 2D TRE, similar methodologies may be used. Static 2D emission imaging may be employed, such as Hamamatsu Phemos™ series, DCG System Meridian platform, where time information is not available. Laser Voltage Probing, such as DCG Systems Ruby system, may be used in both single point and 2D configurations, and laser stimulation techniques of many types may be employed. Other equipment is also contemplated.

It should be understood that a set of stimuli may be applied in succession and a single type of tool may be used to take the corresponding measurements. Alternatively, different tools and types of measurements may be used during an experiment for a given set of stimuli. Any combination of stimuli and measurements may be employed.

The processing unit 404 and program 408 combine the knowledge of the circuit, stimuli, and expected behavior to increase the information value of the measurements. For example, in determining switching gates, if the schematic design shows three gates are supposed to be switching at a same time under a particular condition and only one gate is switching in the collected image then two gates are not functioning properly.

The processing unit 404 and program 408 use feedback 322 to expand the value of a single measurement at a single condition. In particular, determinations, such as, a partial or complete combination of some of the elements of the system 400 would be useful in achieving a stated goal. Knowledge of the specific circuit design and implementation of the region of interest can be exploited. For example, one would be able to modify appropriately the state and operation of the circuit. Knowledge of the specific layout implementation along with the design and schematic can be employed so that interaction of neighboring gates may be understood and taken advantage of.

In one example, one would be able to predict if the there is a source of background emission or noise near the probe point, and by knowing the circuit, appropriate steps may be taken to reduce the effect. Knowledge of the specific state and operating conditions of the circuit can be considered, and this information can be extracted from each measurement to improve/optimize/change the next set of selected stimuli. For example, by altering a certain knob in the stimuli set and measuring its effect on the measurement, one could predict what needs to be done, or better understand the circuit behavior, or identify faulty behaviors that were not expected from the design, or debug the test pattern so that the desired behavior is achieved.

Post processing the set of measurements in a combined fashion and with all the knowledge available can be used to create more value in a single measurement. One goal is towards improving the localization of the gates of interest (when their position is not known) or better separate (isolate) their contributions from neighboring gates or structures. It should be understood that while the system 400 may be fully automated, a user interface 422 and display 420 are preferably employed to permit interaction with the system 400 and user viewing of images for analysis and feedback.

The processing unit 404 may combine the information of multiple measurements. For the case of 2D images, in image processing block 411, subtraction, comparison, and, in general, linear operations of the images may be useful to identify changes caused by changing the stimuli. When the time information is available (either with a single pixel/1D detector or 2D detector), time transformations such as Fast Fourier Transformation (FFT) may be used, for example, to identify certain frequency and phase components in block 409.

The system 400 generalizes the types of stimulus from a frequency component based system (FIG. 1) to many other types of stimuli. The measurement tools and methodology are not limited to emission based tools or time resolved emissions, but are generalized to static tools, single point and 2D tools, laser voltage probe tools, laser stimulation systems and others. The type of analysis performed by processing unit 404 may include FFT (block 409) but is broader than the FFT analysis and may provide image manipulations, statistics, etc. The present principles provide localization and also include resolution/separation improvements.

Figure 11:
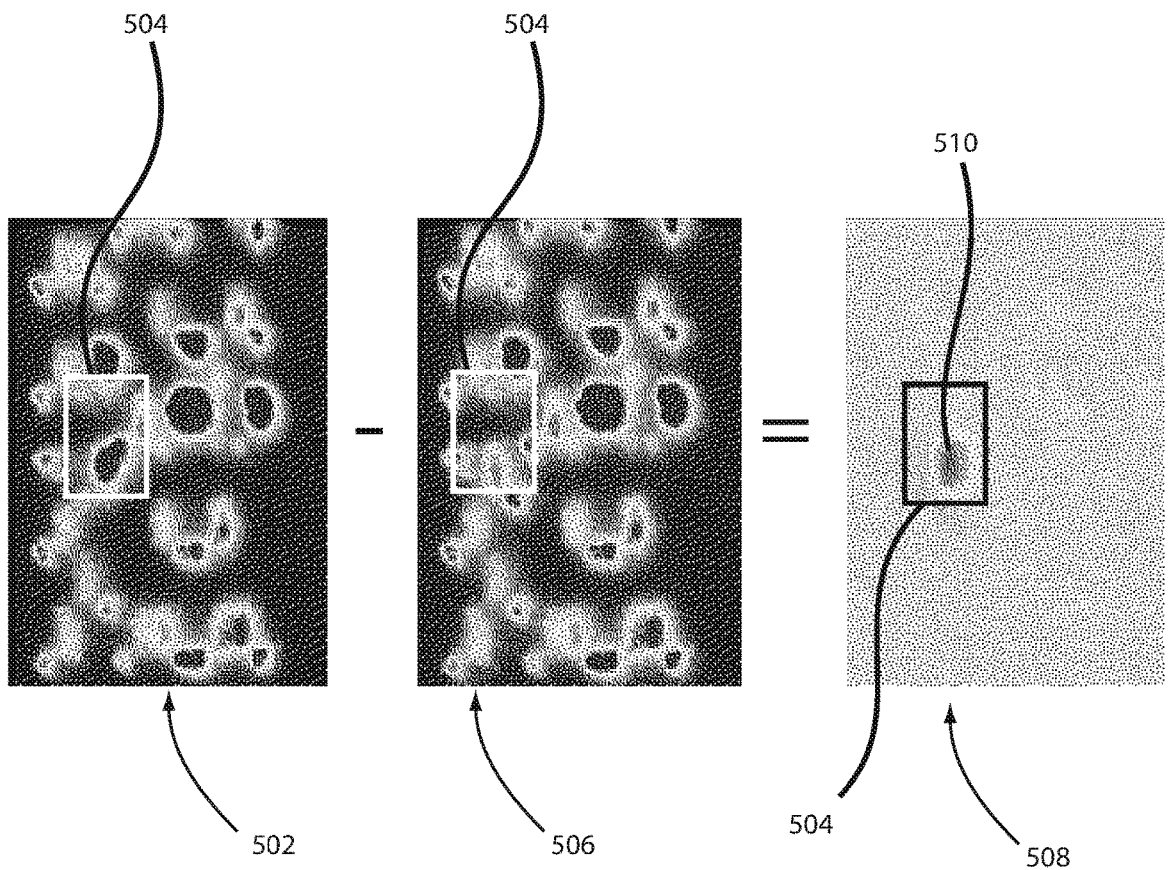
FIG. 11 shows emission images taken before and after a clock of the device being imaged is turned off, the images being employed to localize a switching device in accordance with one illustrative example.

Referring to FIG. 11, a first example based on static emission measurements is illustratively shown. In this case, two different stimuli are provided to a chip. In one case a 10 MHz clock signal (although other values may be used) is provided. The test chip includes a 45 nm chip (DUT) that was imaged using a Peltier cooled InGaAs camera from Hamamatsu™ for approximately one minute using a solid immersion lens (SIL). A resulting image 502 shows photon emissions from switching and leakage in a region 504. A second image 506 shows photon emissions from leakage only in region 504 after the 10 MHz clock has been removed. All other conditions such as test pattern, voltage, temperature, etc. are not changed. By analyzing the combined set of measurements and by using the knowledge of the expected effect of the two stimuli one can immediately understand that gates that are not reached by the clock will not change their emission signature in the two measurements, while gates affected by the clock will change their emission signature. Therefore, by appropriate image manipulation, such as subtraction of the two images, a difference image 508 localizes which gates are switching among the many gates visible in the two previous images 502 and 506. In this case, switching NFET 510 in region 504 is determined. The same methodology can also help in improving the separation, besides the localization, since the interference due to the emission from neighboring non-switching gates can be easily removed.

Another example based on static emission measurements may also include two stimuli by changing an initialization pattern of the chip. One image corresponds to a stimulus that causes all the latches of the chip to assume a logic state "1", while another image corresponds to a pattern where all latches assume a logic state "0". By subtracting the two images, one can immediately localize the gates of interest because they are the only circuits affected by the stimulus change. Additionally, the spatial separation of the contributions from the transistors composing a large buffer increases, thus making for easier identification of the contributions from NFETs and PFETs.

In another example, two test patterns may be used as stimuli where the content of only one latch (or only some latches of interest) may be altered between logic state "1" and "0" (or vice versa), while the remaining latches on the DUT 12 are left unaffected. By acquiring the emission images corresponding to the two stimuli and analyzing them in a combined fashion, for example, during an image subtraction, one could identify the position of the latch (or latches) of interest among the many latches available on the chip. This is particularly useful when, for example, a latch is identified during an electrical test, but its physical position on the DUT 12 is not known or is not easy to determine.

A similar example involves memory arrays such as, e.g., DRAM, SRAM, EDRAM, MRAM, etc. Often the specific location of a memory cell is not easily derived from its logic address as used by an ATE, tester, or software program testing the DUT 12. Therefore, by addressing a memory cell and changing its content between its possible logic states, for example "1" and "0", while keeping the rest of the memory array unaltered, one could locate the affected memory by acquiring emission images of the cell at different logic states, again taking an image subtraction of the acquired images.

In yet another example, useful for testing broken scan chains (scan chain diagnostics), one could apply a set of stimuli requiring the latches of the scan chain to acquire desired logic states. By acquiring corresponding emission images and analyzing them together (for example by image subtraction) one could observe that the stimuli change has an effect on the latches of the scan chain that are before the breaking point and therefore are working as expected. On the other hand, the stimuli will not be able to reach and alter the state of the latches after a breaking point in the scan chain. Therefore, by locating the position(s) in the images where the logic state is not altered one could easily localize the position of the failure.

In yet another example, based on static emission measurements, a clock frequency is changed between two different values (e.g., 2.5 GHz and 2 GHz) and the corresponding measurements are subtracted to highlight macro circuits that are interacting with the clock. A particularly interesting application relates to identifying the macro or structures that are participating/involved in the execution of a particular test program or functional exerciser. By running the program at two different frequencies (possibly just slightly different, larger frequency differences may increase the signal to noise (SNR) of the subtracted image but may also cause complications such as temperature changes), the static emission images corresponding to such conditions are acquired, and processing the images, for example, through a subtraction process, the structures affected by the exerciser are located. It should be noted that additional clock distribution structures, not specifically related to the exerciser, may be highlighted with this technique. By running a different exerciser, one could identify the areas that are always common, thus removing them from the analysis.

Time resolved emission methodologies may also be employed to determine switching gates as explained above with respect to, e.g., FIGS. 1-4.

Figure 12:
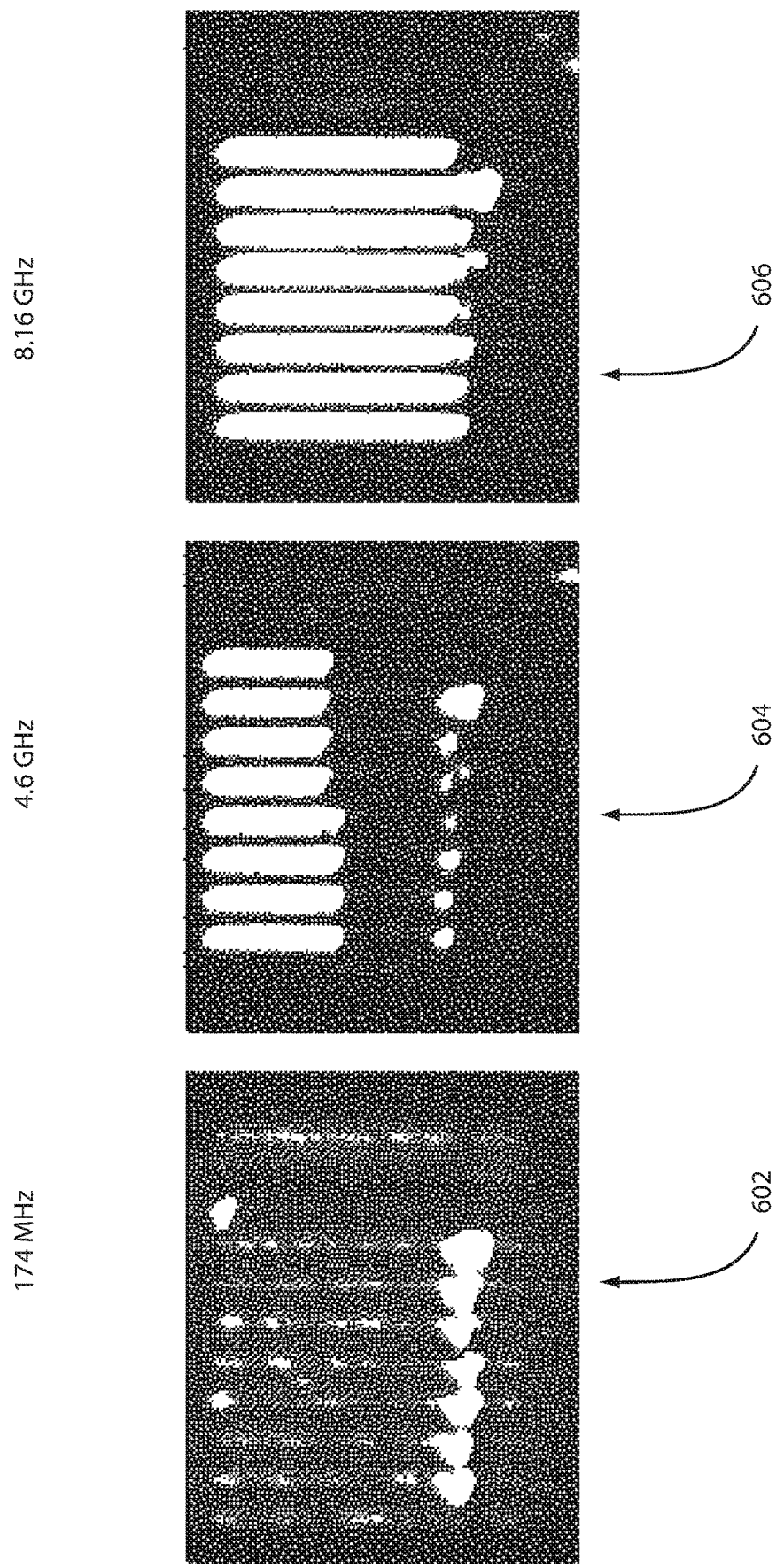
FIG. 12 shows emission images taken after changing an operating frequency of the device being imaged to control gate activation in accordance with another illustrative example.

Referring to FIG. 12, another example based on static emission measurements is illustratively shown. Different patterns are loaded to the chip to change the operating frequency of an on-chip phase-locked loop (PLL). For each operating point a static emission measurement is acquired. The three explanatory images 602, 604 and 608 are acquired at different operating frequencies of 174 MHz, 4.6 GHz, and 8.16 GHz, respectively. Notice that there is some common circuitry at the bottom of each image that remains constant while a progressively larger portion of the digital controlled oscillator (DCO) is filled by switching gates (bright emission spots). By taking images at finely changing frequencies and composing them into a video, the linearity of the DCO can be studied and defective components of the circuit can be localized which show up as dark regions in the field of bright gates. Additionally, at very small frequency increments, one would be able to progressively turn on only one gate at the time, thus permitting a very precise localization of each gate.

Figure 13:
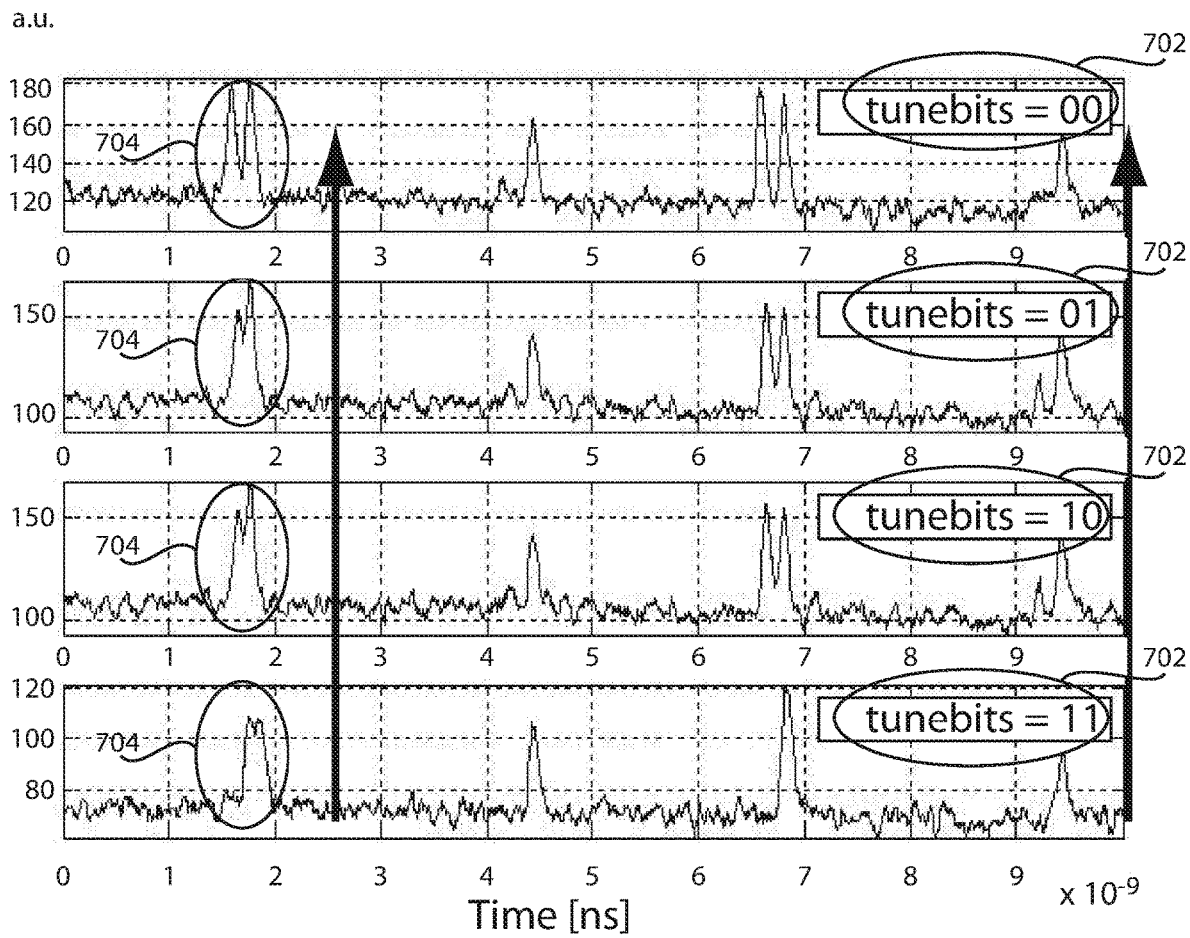
FIG. 13 shows four plots of emission peaks versus time for four circuit settings which are changed to increase peak separation and change delay in accordance with another illustrative example.

Referring to FIG. 13, an example using TRE is illustratively shown. In this case, different patterns are used to initialize the chip with different values of "tune bits" 702, for example from "00" to "11", to change the property of an affected circuit, in this specific case, a variable delay line. By changing the tune bit 702, one can alter the relative time separation (delay) of two signals coming from adjacent gates shown as two emission peaks in circles 704. Note emission intensity in arbitrary units (a.u.) is plotted versus times in FIG. 13. It is clear that by changing the tune bit 702 value from "11" to "00" a much better separation of the peaks in circles 704 is achieved. This permits better localization of the peaks in time if time delay or skew measurements have to be performed. Moreover, it may be noticed that only one of the two peaks is moved by the tune bits thus clearly identifying the emission peaks associated with the gate affected by the tune bit and the neighboring gate that is not affected by the tune bits.

Figure 14:
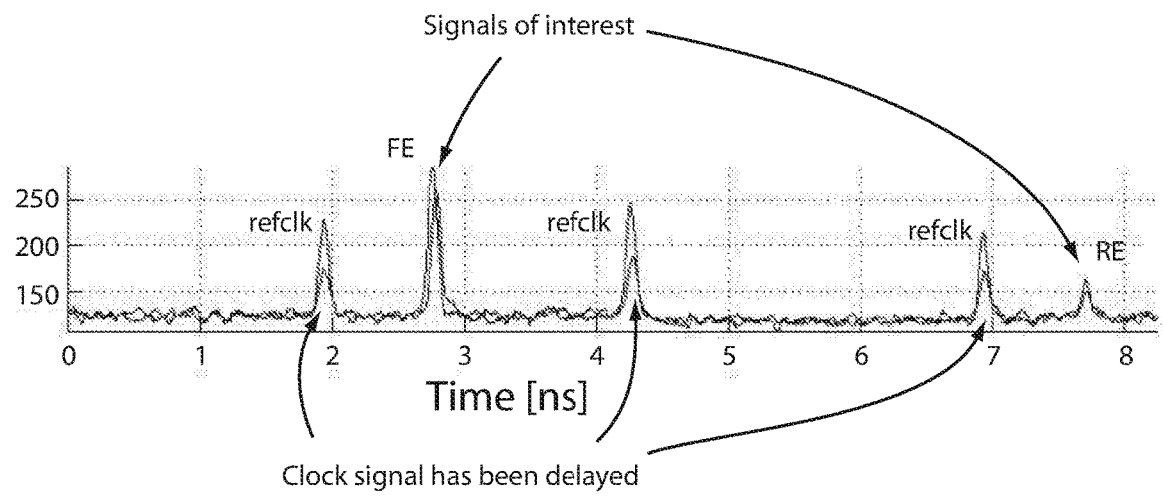
FIG. 14 shows a plot of emission peaks versus time for a circuit having a changed clock delay to separate reference clock peaks from signals of interest in accordance with another illustrative example.

Referring to FIG. 14, another TRE example is illustratively shown. In this case, an original test pattern caused the clock switching signal "refclk" to be very close in time with both a rising edge "RE" and a falling edge "FE" of the signal of interest thus making it very difficult to identify them (not shown). By changing the test pattern, a relative delay is introduced between the signal (RE and/or FE) and the reference clock (refclk) as shown. This significantly improves the localization in time of the switching emission signal.

Having described preferred embodiments of a method and system for quickly identifying circuit components in an emission image (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for localization and resolvability of an integrated circuit comprising:
    selecting one or more electrical stimuli to be applied to a device under test such that the electrical stimuli provide a baseline image and a distinguishing image effect when applied to the device under test;
    applying the one or more electrical stimuli to the device under test;
    measuring emissions from the device under test to provide a measurement data set and to collect the baseline image and the distinguishing image effect, said measuring comprising dividing a field of view in a photon emission image into regions of interest;
    analyzing the measurement data set using a processor to localize and evaluate circuit structures by comparing the baseline image and the distinguishing image effect, said analysis comprising performing a fast Fourier transform (FFT) in each region of interest to calculate a respective figure of merit for each region of interest that represents a degree of switching activity in the respective region of interest; and
    repeating the measuring of emissions on a finer grained image at a finer resolution.

2. The method as recited in claim 1, wherein applying the one or more electrical stimuli includes one or more of: changing a signal phase/delay, changing a state of a gate, enabling/disabling gates of sub-circuits, changing a functional exerciser, changing one or more supply voltage, enabling/disabling a source of electrical noise, and changing a duty cycle.

3. The method as recited in claim 1, wherein measuring emissions includes measuring at least one of: scanning Time-resolved Emission (TRE) images, Laser Voltage Probing (LVP) waveforms from a single point, and 2D Laser Voltage Probing (LVP) data obtained by raster scanning with a laser.

4. The method as recited in claim 1, wherein analyzing comprises at least one of: employing knowledge of a circuit design and layout, employing effects of previous conditions for each optical measurement, post processing the data set in a combined fashion to extract information; and identifying and isolating circuit components.

5. The method as recited in claim 1, wherein analyzing comprises post processing the data set by manipulating a time resolved waveform.

6. The method as recited in claim 1, wherein analyzing the measurement data set includes comparing a first photon emission image taken with the device under test reacting to a first stimuli to a second photon emission image taken with the device under test reacting to a second stimuli to identify one or more components changing states.

7. The method as recited in claim 1, wherein measuring emissions from the device under test includes generating an emissions image from emissions during a first time period and updating the emissions image with new emissions for a second time period.

8. The method as recited in claim 1, further comprising creating a new stimuli set to converge to an improved measurement set based upon feedback of measured emissions.

9. A non-transitory computer readable storage medium comprising a computer readable program, wherein the computer readable program when executed on a computer causes the computer to perform the steps of:
    selecting one or more electrical stimuli to be applied to a device under test such that the electrical stimuli provide a baseline image and a distinguishing image effect when applied to the device under test;
    applying the one or more electrical stimuli to the device under test;
    measuring emissions from the device under test to provide a measurement data set and to collect the baseline image and the distinguishing image effect, said measuring comprising dividing a field of view in a photon emission image into regions of interest;
    analyzing the measurement data set using a processor to localize and evaluate circuit structures by comparing the baseline image and the distinguishing image effect, said analysis comprising performing a fast Fourier transform (FFT) in each region of interest to calculate a respective figure of merit for each region of interest that represents a degree of switching activity in the respective region of interest; and
    repeating the measuring of emissions on a finer grained image at a finer resolution.

10. A system for localization and resolvability of an integrated circuit comprising:
    an electrical stimuli component configured to apply a set of stimuli to a device under test such that the electrical stimuli are selected to provide a baseline image and a distinguishing image effect when applied to the device under test;
    an emission measurement system configured to collect emissions from the device under test to provide a measurement data set and to collect the baseline image and the distinguishing image effect, said emission measurement system being further configured to divide a field of view in a photon emission image into regions of interest;
    a data comparison module configured to analyze the measurement data set by performing a comparison between the baseline image and the distinguishing image effect to localize and evaluate circuit structures of the device under test, said analysis comprising a fast Fourier transform (FFT) in each region of interest to calculate a respective calculation of a figure of merit for each region of interest that represents a degree of switching activity in the respective region of interest; and
    an image processor configured to repeat collection of emissions in a finer grain image to analyze the finer grain image regions of interest at a finer resolution.

11. The system as recited in claim 10, wherein the electrical stimuli component is configured to provide one or more of: a signal phase/delay change, a state change of a gate, activation/deactivation of gates of sub-circuits, a functional exerciser change, one or more supply voltage changes, a change in electrical noise intensity or source, and a duty cycle change.

12. The system as recited in claim 10, wherein emission measurements include at least one of: a scanned Time-Resolved Emission (TRE) image, a Laser Voltage Probing (LVP) waveform from a single point, and 2D Laser Voltage Probing (LVP) data obtained by raster scanning with a laser.

13. The system as recited in claim 10, wherein the data comparison module is configured to analyze and compare images taken with different stimuli sets to identify and isolate circuit components by using at least one of: knowledge of a circuit design and layout; effects of previous conditions of optical measurements; and information extracted by post processing of the data set.

14. The system as recited in claim 10, wherein the data comparison module processes at least one of: time resolved waveform manipulation data.

15. The system as recited in claim 10, wherein the data comparison module analyzes the measurement data set by comparing a first photon emission image taken with the device under test reacting to a first stimuli to a second photon emission image taken with the device under test reacting to a second stimuli to identify one or more components changing states.

16. The system as recited in claim 10, wherein the emission measurement system includes a Picosecond Imaging for Circuit Analysis (PICA) system.

17. The system as recited in claim 10, further comprising a feedback loop for creating a new stimuli set to provide a new measurement based upon feedback of measured emissions.

18. A system for localization and resolvability of an integrated circuit comprising:
an electrical stimuli component configured to apply a set of stimuli to a device under test such that the electrical stimuli are selected to provide a baseline image and a distinguishing image effect when applied to the device under test;
a Picosecond Imaging for Circuit Analysis (PICA) system configured to collect photon emissions from the device under test for each electrical stimuli in the set of stimuli to provide a measurement data set and to collect the baseline image and the distinguishing image effect, said PICA system being further configured to divide a field of view in a photon emission image into regions of interest;
a photon database configured to collect information for emitted photons to generate at least one of a static image and a time-resolved image corresponding to at least two states associated with stimuli in the set of stimuli;
a data comparison module configured to analyze the measurement data set to localize and evaluate circuit structures of the device under test by performing image processing between images of the two states, said analysis comprising a fast Fourier transform (FFT) in each region of interest to calculate a respective figure of merit for each region of interest that represents a degree of switching activity in the respective region of interest; and
an image processor configured to repeat collection of photon emissions in a finer grain image to analyze the finer grain image regions of interest at a finer resolution.

19. The system as recited in claim 18, wherein the electrical stimuli component is configured to provide one or more of: a signal phase/delay change, a state change of a gate, activation/deactivation of gates of sub-circuits, a functional exerciser change, one or more supply voltage changes, a change in electrical noise intensity or source, and a duty cycle change.

20. The system as recited in claim 18, wherein the PICA system includes a two-dimensional (2D) time resolved Picosecond Imaging for Circuit Analysis (PICA) emission image, a 2D time integrated (static) emission image, and a scanned Time-resolved Emission (TRE) image.

21. The system as recited in claim 18, wherein the data comparison module is configured to analyze and compare images taken with different stimuli sets to identify and isolate circuit components by using at least one of: knowledge of a circuit design and layout; effects of previous conditions of optical measurements; and information extracted by post processing of the data set.

22. The system as recited in claim 18, further comprising a feedback loop for creating a new stimuli set to provide a new measurement based upon feedback of measured emissions.

* * * * *